(12) United States Patent
Shum

(10) Patent No.: US 8,384,107 B1
(45) Date of Patent: Feb. 26, 2013

(54) INCREASING THE BRIGHTNESS OF A LIGHT SOURCE BY USING A THIN-FILM DIELECTRIC

(76) Inventor: Frank Shum, Sunnyvale, CA (US)

( * ) Notice: Subject to any disclaimer, the term of this patent is extended or adjusted under 35 U.S.C. 154(b) by 0 days.

(21) Appl. No.: 12/820,834

(22) Filed: Jun. 22, 2010

Related U.S. Application Data

(60) Provisional application No. 61/219,208, filed on Jun. 22, 2009.

(51) Int. Cl.
*H01L 33/00* (2010.01)

(52) U.S. Cl. ............................ 257/98; 257/79; 257/99

(58) Field of Classification Search .................. 257/79, 257/98, 99; 357/16, 17, 18
See application file for complete search history.

(56) References Cited

U.S. PATENT DOCUMENTS

| | | | | |
|---|---|---|---|---|
| 3,877,052 A | * | 4/1975 | Dixon et al. | .................. 257/95 |
| 6,809,342 B2 | * | 10/2004 | Harada | ........................ 257/79 |
| 8,033,706 B1 | * | 10/2011 | Kelly et al. | .................. 362/607 |

* cited by examiner

*Primary Examiner* — Phuc Dang
(74) *Attorney, Agent, or Firm* — Aka Chan LLP

(57) ABSTRACT

An improved lighting system by increasing the effective brightness of a lighting source.

15 Claims, 11 Drawing Sheets

INCREASING THE BRIGHTNESS OF A LIGHT SOURCE BY USING A THIN-FILM DIELECTRIC

CROSS-REFERENCE TO RELATED APPLICATIONS

This patent application claims the benefit of U.S. provisional patent application 61/219,208 filed Jun. 22, 2009, which is incorporated by reference along with all other cited references in this application.

BACKGROUND OF THE INVENTION

This invention relates to the field of lighting and illumination. More particularly, this invention relates to technique to increase the brightness of a light emitting diode or similar lighting source.

Since the development of the incandescent light bulb, electric lighting has become widely adopted and is considered one of the inventions which has had the most profound impact on human society. Lighting allows people to do many activities in the night hours which they would otherwise not be able to do without such lighting. Modern society and all cities in the United States depend on electric lighting.

Despite the success of modern electric lighting, there continues to be a need for improvements in electric lighting. For example, it is desirable to increase lighting brightness, improve efficiency, reduce power consumption, reduce heat output, and improve other characteristics of lighting sources.

Therefore, there is a need to increase the brightness of a lighting source.

BRIEF SUMMARY OF THE INVENTION

A dielectric layer or a stack of dielectric layers are used to increase the effective brightness of a light source. In one embodiment, the light source may be an LED chip. In another embodiment, the light source is a LED fixture containing a LED. The dielectric layer can be a variety of materials as required to adjust the overall angular acceptance of the dielectric layer or stack of layers. Additionally, the structure can have a smoothing layer as part of the LED semiconductor surface before the application of the dielectric layer or stack of layers.

In an implementation, an LED device includes: an LED chip; a scattering mechanism formed as part the LED chip; an exit aperture on the LED chip where a majority (e.g., 50 percent or more, 80 percent or more, 90 percent or more, or 95 percent or more) of light emitted by the LED chip exits; at least one dielectric layer attached to the LED chip exit aperture; at least one reflective layer attached to the LED chip; and a full width half angle of a light emission profile is less than a hundred degrees.

In various implementations, the dielectric layer includes at least four dielectric layers. For example, there may be five or more dielectric layers. The scattering mechanism can have a textured surface. The textured surface can be part of an exit surface. The textured surface can include a smoothing layer on which the dielectric layer is attached.

The full width half maximum of the light emission profile is less than 90 degrees. The full width half maximum of the light emission profile is less than 80 degrees. The full width half maximum of the light emission profile is less than 60 degrees. The full width half maximum of the light emission profile is less than 40 degrees.

In an implementation, an LED device includes: an LED chip; a scattering layer attached to the LED chip; an exit aperture on the LED chip through which light emitted by the LED chip exits; at least one dielectric layer attached to the LED chip exit aperture, where the dielectric layer transmits light of low angles, and the dielectric layer reflects light of higher angles toward the scattering layer or reflective layer, or both; at least one reflective layer attached to the LED chip where the reflective layer redirects light back towards the exit aperture of the LED; and a full width half angle of a light emission profile is less than a hundred degrees.

In an implementation, an LED light source includes: an LED chip in a cavity, where the cavity includes a highly reflective wall and a light exit aperture, and at least a portion of a cavity wall scatters light; one or more dielectric layers at the light exit aperture, where the dielectric layer transmits light of low angles, and the dielectric layer reflects light of higher angles toward the scattering layer or reflective layer, or both; and a full width half angle of a light emission profile of light out of the cavity is less than a hundred degrees.

In various implementations, the full width half angle of the light emission profile is less than less than 80 degrees. The full width half angle of the light emission profile is less than less than 60 degrees. The full width half angle of the light emission profile is less than less than 40 degrees.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
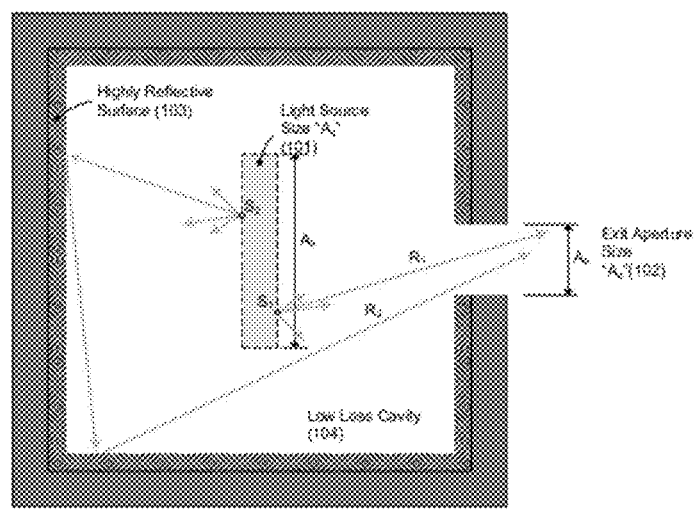
FIG. 1 shows an example of an embodiment of a recycling system that uses geometries in a cavity to increase source brightness.

The invention increases the brightness of a light emitting diode (LED) devices at the chip level thereby overcoming the disadvantages of increasing the brightness of an LED through at higher levels such as packaging level or at the system level. In addition, the implementation is advantageous over other chip level implementations as it is compatible with surface texturing, does not require etching of holes, and needs only one reflective surface that does not have to be specular.

Brightness Discussion

A light source has at least three key characteristics: its optical power (P), the area (A) from which the power originates and the solid angle (θ) into which the power is emitted. A fundamental characteristic called "brightness" (B) combines these three characteristics as measured in power per area per solid angle and whose relationship is expressed in equation 1. This measurement of brightness is also known as luminance in photometric units and known as radiance in radiometric units.

$$B = \frac{P}{A \cdot \theta} \quad \text{Equation 1}$$

As shown in equation 1, brightness is inversely proportional to the area of a light source. For instance, the small area of a high intensity discharge (HID) lamp results in a greater brightness than the broad area of a florescent lamp, even if the two lamp types have equal optical powers. Also as shown in equation 1, brightness is inversely proportional to the solid angle. For instance, a collimated laser source is much brighter than after it is scattered randomly from a diffuse surface. This is because, after the laser is scattered, the laser light is emitted randomly into a much larger solid angle with its original angular characteristics lost. Brightness is a fundamental characteristic. The brightness theorem states the source cannot be reimaged or re-concentrated to a higher brightness than the source itself.

Brightness fundamentally defines the minimum physical size of the optical elements in a system. In the design of directional lighting such as headlights or flashlights, the lens or reflector diameter is directly proportional to the brightness of the light source. In other directional systems such as reflector lamps (e.g., MR, PAR, R, BR, or B) the optical diameter is fixed, the power per steradians or candela power is entirely dependent on the brightness of the source.

Assuming a fixed optical power (P), the less bright the light source, the larger the optics has to be to collect the light, thereby increasing cost and complexity. In other systems, the low brightness of the light source may render the systems physically impossible to build. For example, although florescent light sources can emit a lot of optical power, they are comparatively less bright. Thus systems such as headlights, projection TVs, flashlights, and reflector lamps do not generally use fluorescent light. This limits the addressable market for such light sources.

Therefore it is highly desirable to increase the brightness of light sources and is the subject matter of this invention.

Geometries to Increase Source Brightness

Although it is not possible to reimage or concentrate the source to a higher brightness than the source itself, it is possible to increase brightness of the source itself. This is accomplished by "recycling" the undesirable light back at the source. In such a system, the undesirable light is "recycled" back until it exits a lighting system in the desirable area, angle, or both.

Schemes to increase brightness can at first seem to be a violation of the brightness theorem and the laws of thermal dynamics. The brightness theorem is typically proven by showing an image of the source cannot be brighter than the source itself. However, this does not necessarily mean you cannot increase the brightness of the source itself. Ling Fu et al., *Proceedings of the SPIE*, Beating the Brightness Theorem: Thermodynamics of Light Recycling, Volume 6033 pp. 23-28 (2005), which is incorporated by reference along with all other reference cited in this patent.

In the case of a filament light bulb, if a reflector is placed around the filament such the majority of the bulb's optical energy is incident back on to the filament, the result would be a self heating of the filament. The hotter filament is then brighter than the cooler filament without the reimaging of the energy. An example of this generic recycling system is shown in FIG. 1.

FIG. 1 shows a generic lighting system. A light source 101 with a power "$P_s$" is enclosed in a low loss cavity 104 and emits light uniformly across its entire surface area "$A_s$" and uniformly into all solid angles of a sphere "$\theta_s$" (4p steradians). The brightness of this source is given by the equation:

$$B_s = \frac{P_s}{A_s \cdot \theta_s} = \frac{P_s}{A_s \cdot 4\pi} \quad \text{Equation 2}$$

Highly reflective walls 103 line the walls of the low loss cavity 104. In the wall of the cavity, there is an exit aperture 102 of a size "$A_e$" from which light can escape. Although some light such as point "$S_1$" can directly escape from the exit aperture without encountering the walls of the cavity, the majority of the light such as from point "$S_2$" will randomly scatter off the interior cavity surface multiple times before finally exiting through the aperture 102. Assuming there is no optical absorption by the either the walls or cavity, eventually light will scatter until it escapes through the exit aperture. Thus, the power exiting the aperture ($P_e$) is equal to the power from the source ($P_s$) as shown in equation 3.

$$P_e = P_s \text{ (for a lossless cavity)} \quad \text{Equation 3}$$

However, the angle of light exiting the aperture "$\theta_e$" is only half a hemisphere or 2p steradians. The brightness of the exit aperture is given by:

$$B_e = \frac{P_e}{A_e \cdot \theta_e} = \frac{P_s}{A_e \cdot 2\pi} \quad \text{Equation 4}$$

Combining equations 2 and 4, we obtain:

$$B_e = B_s \frac{A_s \cdot \theta_s}{A_e \cdot \theta_e} = 2 B_s \frac{A_s}{A_e} \quad \text{Equation 5}$$

For the case where the source areas are equal ($A_s = A_e$), the exit aperture's brightness is twice that of the source brightness:

$$B_e = 2 B_s \text{ (for } A_s = A_e\text{)} \quad \text{Equation 6}$$

For cases where the exit aperture area is smaller than the source area ($A_s > A_e$), the exit aperture's brightness becomes even greater:

$$B_e > 2 B_s \text{ (for } A_s > A_e\text{)} \quad \text{Equation 7}$$

In reality, there is always some loss of power while in the cavity. This is because most light will have to reflect off the cavity walls many times before escaping. Any small amount of light loss will become significantly amplified. It is therefore extremely important to minimize any light loss mechanism in the cavity. For the case $A_s = A_e$, it is possible to lose up to half the optical power and still the exit aperture will be brighter than the source.

To further maximize light output, all the light in a recycling system should have the possibility to escape from the exit aperture. In some recycling systems, some light can become "trapped" when the rays of light retrace the same path over and over again without exiting. Generally, the incorporation of a scattering mechanism into the system will randomize the ray paths enough to prevent light trapping.

In other recycling systems, the reflection surface can be very close or even part of the source itself. For example, in the case of light emitting diode chips, the refection surfaces are part of the LED chip structure. This also occurs in the case of backlights where the light guide itself is the source and a highly reflective material is placed right underneath the light guide.

In the case of backlights, it is desirable to increase brightness by reducing the output angle ($\theta_s$) without reducing the source area ($A_s$). Typically a brightness enhancement film is used to recycle the undesirable angles back into the cavity where it scatters until it reaches the brightness enhancement film within the allowable exit angle ($\theta_e$). The term brightness enhancement film often refers to materials such as described in U.S. Pat. No. 6,760,157, assigned to the 3M Corporation; however it is used for the purpose of this application to refer to any film material that has a mechanical geometrical structure, such as prisms, where restriction of the transmission angle ($\theta_s < \theta_e$) is based purely on geometrical optics.

Figure 2:
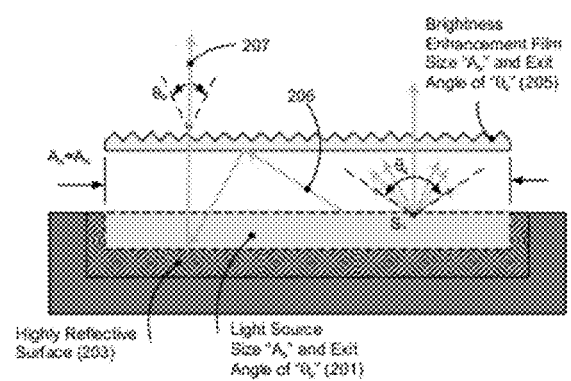
FIG. 2 shows an example of an embodiment of a recycling system that uses a brightness enhancement film to increase source brightness.

FIG. 2 shows a system using brightness enhancement materials. The light source 201 emits light into a solid angle of "$\theta_s$." Immediately in front of the light source is a brightness enhancement film 205 that only allows light within solid angle less than "$\theta_e$" to exit. Light 206 greater than "$\theta_e$" is reflected from the film and back into the cavity with highly reflective surface 203. The light recycles back and forth within the cavity until it is incident on the bright enhancement film within the allowable acceptance angle "$\theta_e$" at which time it is transmitted 207. Assuming there is little or no loss in power ($P_e = P_s$), the brightness enhancement's area is similar to the source ($A_s = A_e$), and the light exiting the film is more directional than its source ($\theta_s > \theta_e$), then the brightness is increased ($B_e > B_s$) as shown in equations 8 and 9.

$$B_e = B_s \frac{A_s \cdot \theta_s}{A_e \cdot \theta_e} = B_s \frac{\theta_s}{\theta_e} \quad \text{Equation 8}$$

$$B_e > B_s (\text{for } \theta_s > \theta_e) \quad \text{Equation 9}$$

As in the previous recycling system as shown in FIG. 1, a physically realizable system usually results in some loss of the total power reducing the gain in brightness and is therefore important to minimize the light loss of the cavity. The Brightness Enhancement Film should be placed as close to the light source as possible to reduce light escape through any air gap at the edges.

LED Chip Structures

Figure 3:
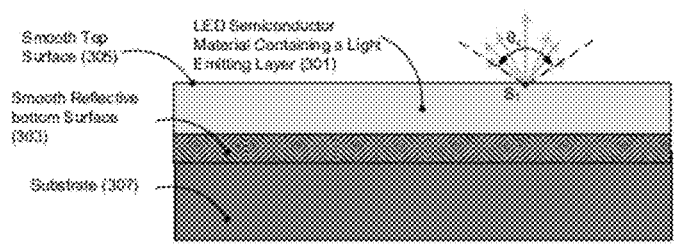
FIG. 3 shows an example of an embodiment of a thin-film LED.

The type of LED chip, the LED structure, the color of LED, the number of LED junctions per chip, or the arrangement of the electrical connection on the LED used in this invention is intended to be very general as long as the passage of electricity causes the generation of light. The LED chip can be made of a semiconductor material such as GaInN, InP, GaAs, InGaAs, AlInGaP, InN, InGaP, or other semiconductor of materials semiconducting material consisting of compounds composed of group III elements (e.g., Al, Ga, and In) or group V elements (e.g., N, P, and As). In one embodiment the LED chip also contains a layer of phosphor material coated on to the LED. The phosphor material absorbs at least a portion of the LED emitted light and converts this to another wavelength. The LED chip can be a non-thin-film LED, a thin-film LED or other LED structure. In the following description of the LED chip, other structures and layers beyond the semiconductor layer itself may be necessary to the function and fabrication have been left off for simplicity. Example of such other layers or materials include passivation layers, electrode structures, current spreading layers, ohmic contact layers, detail of epitaxial structures, buffer layers, specific semiconductor material, substrate materials and FIG. 3 shows an example of a thin-film LED chip structure. The term "thin film" refers to a LED structure 301 where the native growth substrate has been removed and the semiconductor layer is bonded directly on top a secondary substrate 307. The back mirror 303 is typically a smooth surface, but can also be scattering. It is advantageous that very little light escapes from the edges with most of the light exiting the smooth top surface 305. The structure of FIG. 3 with the mirror directly below the semiconductor layer accomplishes this.

Figure 4:
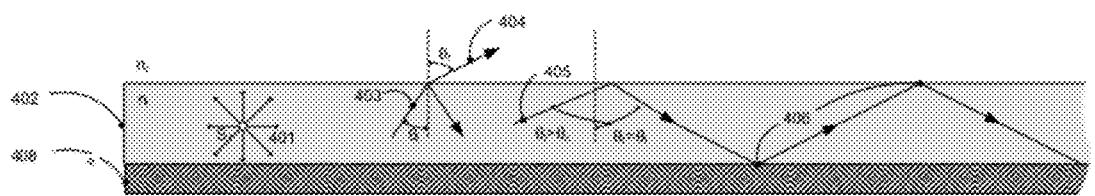
FIG. 4 shows a simplified diagram of the path of light rays within semiconductor material.

FIG. 4 shows light 401 emitted within a layer 402 of the semiconductor into all angles of a semiconductor material. There is a reflective layer on the bottom of the semiconductor layer 408. Light rays incident on the top surface can be reflective and refracted. Light 403 incident at angle "$\theta_i$" is refracted into angle "$\theta_r$" 404 according to Snell's Law, where "$n_i$" is the refractive index of the semiconductor material and "$n_r$" is the refractive index of the exiting medium such as air or an encapsulant as shown by:

$$n_i \sin \theta_i = n_r \sin \theta_r \quad \text{Equation 10}$$

In most cases, the semiconductor has a much higher refractive index than the exiting medium ($n_i > n_r$). For such cases, there exists a critical angle "$\theta_c$" where the light ray will be completely reflected as shown by:

$$\theta_c = \text{Arc Sin}_{n_i}{}^{n_r} \quad \text{Equation 11}$$

$$\theta_c = \text{ArcSin} \frac{n_r}{n_i} \quad \text{Equation 11}$$

If the incident angle is just below the critical angle, the light will be refracted at close to ninety degrees. Simply based on Snell's law, it can be derived the exiting light distribution will be approximately Lambertian. Fred Schubert, *Light Emitting Diodes*, Cambridge University Press 92-96 (2005). Light 405 emitted beyond the critical angle "$\theta_c$" will be trapped or guided within the semiconductor layer, suffering multiple reflections 406 until all the energy is absorbed.

Figure 5:
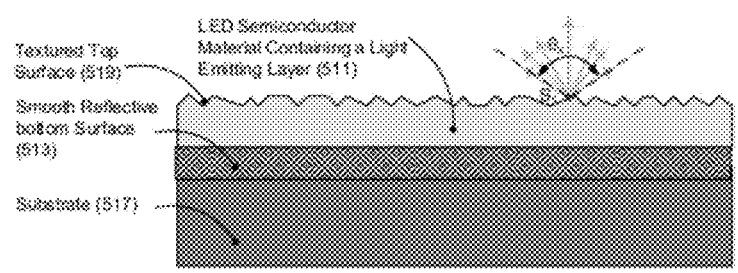
FIG. 5 shows an example of an embodiment of a thin-film LED with surface texturing.

FIG. 5 shows the breaking of the guiding effect and randomizing of the light with a scattering surface texture 519. A substrate 517 is coated with a reflective surface 513 onto which a LED semiconductor layer 511 is bonded. This surface texture can be achieved during the semiconductor growth process or through etching after growth. This light distribution from such a textured surface is also approximately Lambertian.

Figure 6:
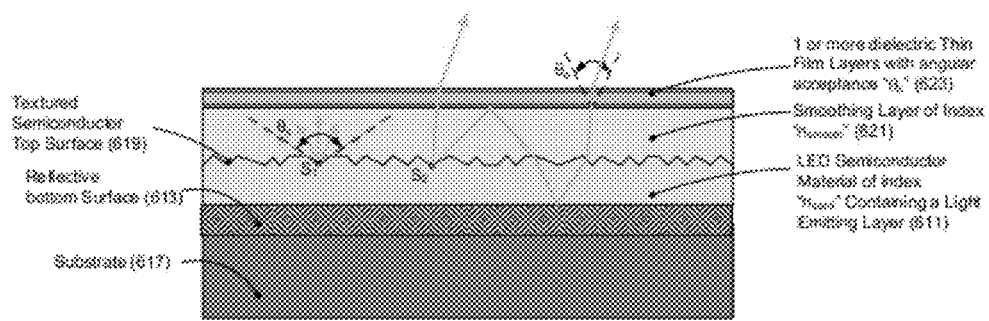
FIG. 6 shows an embodiment of the invention on an LED chip structure with surface texturing.

FIG. 6 shows an embodiment of the invention. The process starts at with a textured surface LED device 619 onto which a layer is added that smoothes out the texture surface 621. This smoothing function can be accomplished by a number of means know in the arts including spin on glass. Spin on glass is a process in which a liquid is applied to fill in the texture surface and cures to a flat smooth top surface. The smoothing function can also be accomplished by coating the rough semiconductor surface with a thick layer of a material such as silicon nitride. The coating process is roughly conformal so that the top surface of this thick material takes on the texture of the underlying layer. Next, a liquid photoresist is applied which fills in the texture and cures to a flat smooth top surface. The selection of the thick conformal material and photoresist is chosen to have the same etch rate. An etching process will then remove both the photoresist and conformal material at the same rate until the conformal material takes on the smooth surface of the photoresist.

The index the optical index of the smoothing layer is chosen to be different than that of the semiconductor layer ($n_{smooth} \neq n_{semi}$), so scattering will still occur across the interface. A dielectric thin film 623 of one or more layers is coated on the top smooth surface. The dielectric film is designed to reflect certain angles of light that would be otherwise be transmitted without it. An example of a dielectric thin-film stack with such a property is shown in table 1. The design technique for thin-film dielectric layers is well documented. Numerous derivative variations are possible to optimize for specific angles, wavelengths, incident and exit mediums, and so forth.

TABLE 1

Sample Example Design of a Dielectric Coating

| Layer # | Material | Thickness |
|---|---|---|
|  | $SiO_2$ | Incident Medium |
| 1 | $TiO_2$ | 1/4 λ |
| 2 | $SiO_2$ | 1/4 λ |
| 3 | $TiO_2$ | 1/4 λ |
| 4 | $SiO_2$ | 1/4 λ |
| 5 | $TiO_2$ | 1/4 λ |
| 6 | $SiO_2$ | 1/2 λ |
| 7 | $TiO_2$ | 1/4 λ |
| 8 | $SiO_2$ | 1/4 λ |
| 9 | $TiO_2$ | 1/4 λ |
| 10 | $SiO_2$ | 1/4 λ |
| 11 | $TiO_2$ | 1/4 λ |
| 12 | $SiO_2$ | 1/4 λ |
| 13 | $TiO_2$ | 1/4 λ |
| 14 | $SiO_2$ | 1/2 λ |
| 15 | $TiO_2$ | 1/4 λ |
| 16 | $SiO_2$ | 1/4 λ |
| 17 | $TiO_2$ | 1/4 λ |
| 18 | $SiO_2$ | 1/2 λ |
| 19 | $TiO_2$ | 1/4 λ |
|  | Air | Exit Medium |

Figure 7:
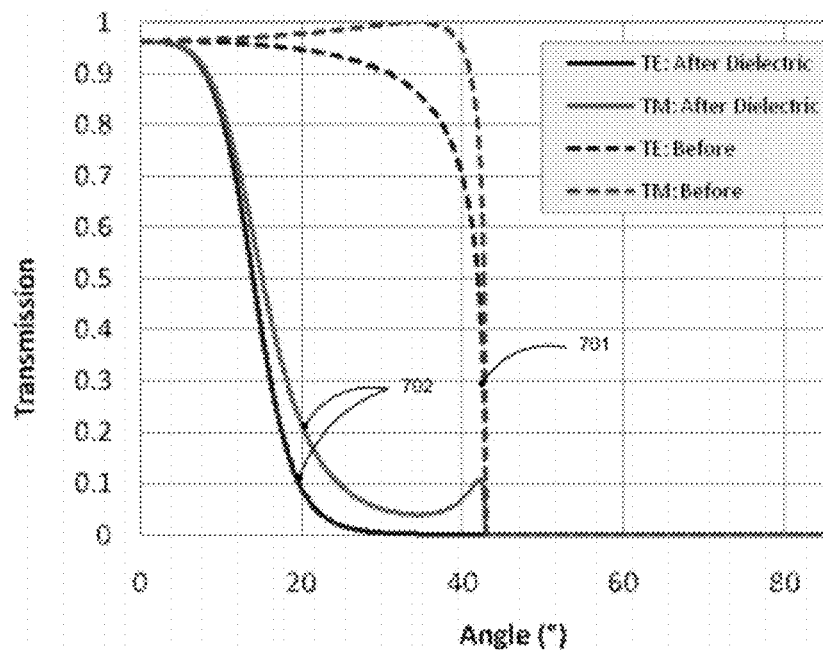
FIG. 7 shows a graph of the effectiveness of the invention at reducing high angle reflectivity at the $SiO_2$ to air interface.

FIG. 7 shows the effectiveness of the dielectric stack of table 1 at reducing the transmission of high angle light. Before the addition of the dielectric coating, there is transmission up to the critical angle of approximately 42 degrees 701. The addition of the dielectric coating significantly reduces the transmission beyond incident angles of 20 degrees 702.

Figure 8:
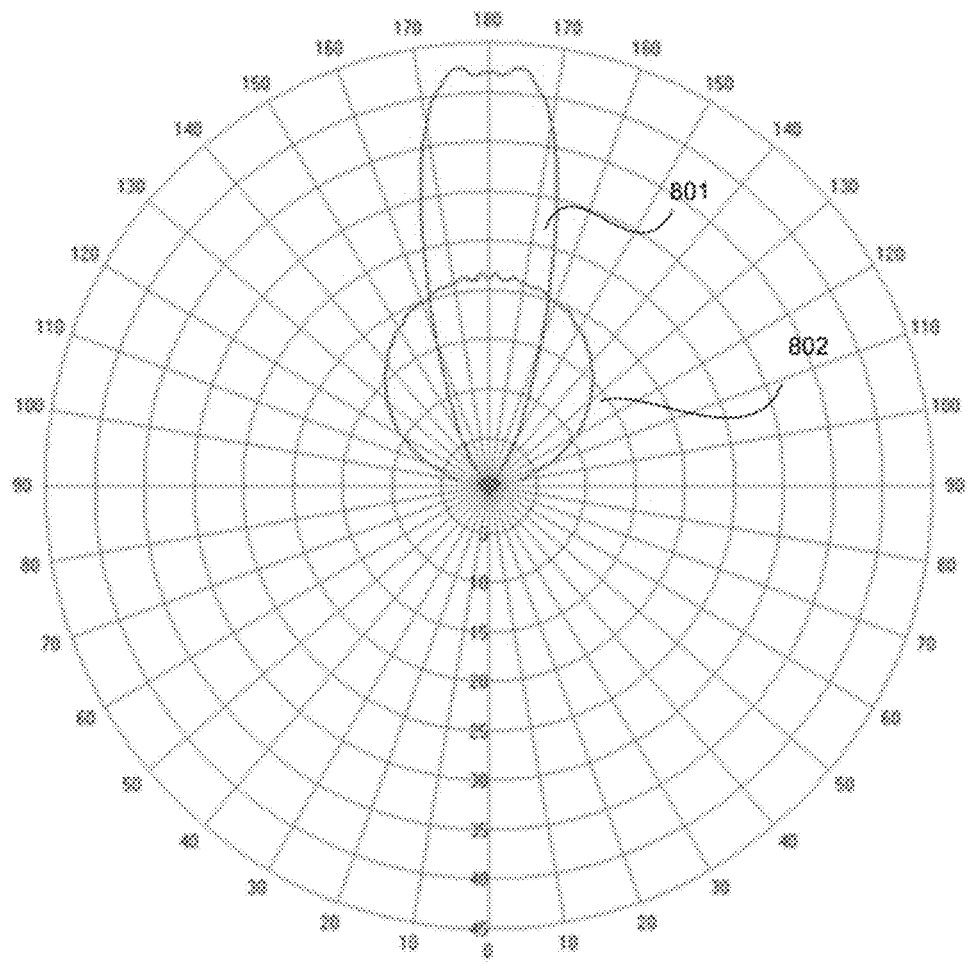
FIG. 8 shows a graph of the light emission pattern before and after the addition of a dielectric stack.

FIG. 8 shows candela power or light emission pattern in units of power per steradians of a sample light source before and after the addition of a dielectric stack of table 1. The light emission from before the dielectric is applied 802 as compared to after the dielectric is applied 801. FIG. 8 is based on optical modeling of a 1×1-millimeter gallium nitride thin-film LED. Since the performance of this configuration depends significantly on the losses in the recycling process, a realistic LED extraction efficiency into air without the dielectric film was set in the model at 65 percent, i.e. 35 percent is absorbed. After the addition of the dielectric film, as illustrated in FIG. 8, the on axis brightness is doubled while the FWHM is reduced by a factor by about 3.5 times from approximately 114 degrees to 33 degrees. Due to the finite absorption in the cavity, the increase in brightness comes at a reduction in the overall light extraction from 65 percent to 23 percent. A significant loss come from the internal absorption from inside the LED itself including from mirrors, electrodes, current spreading layers, and internal absorption in the semiconductor material itself. Reduction in these loses will further improve brightness.

Figure 9:
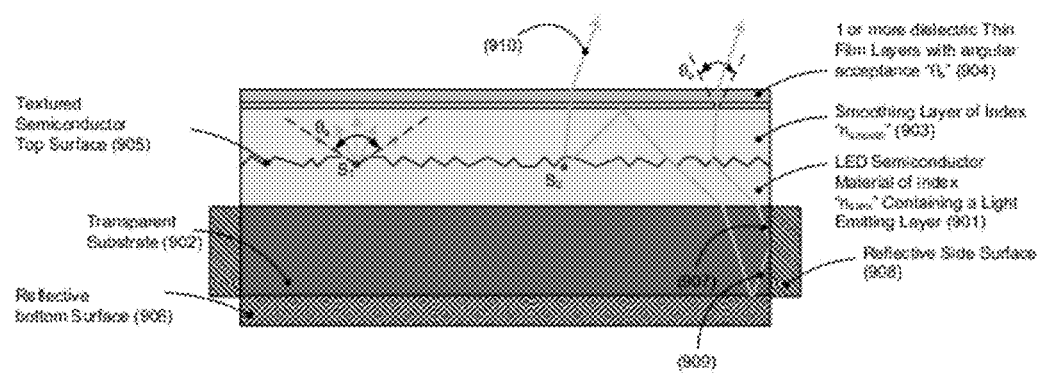
FIG. 9 shows an embodiment of the invention as applied to a non-thin-film LED with a transparent substrate.

Although the discussion up to this point has been directed to mainly to thin-film LEDs, this invention can be applied more broadly to a non-thin-film LED structure. FIG. 9 shows the invention applied to non-thin-film LED structure. The LED semiconductor layer 901 with textured top surface 905 is attached to a transparent substrate 902. The transparent substrate has a reflective bottom surface 906. There is a smooth layer 903 on which one of more dielectric layers 904 are bonded. Side light 907 that would formerly escape the edges is reflected 909 back into the LED by a reflective side layer 908. The reflected side light is recycled within the cavity until it eventual escapes 910 with the top surface through the dielectric stack.

Figure 10:
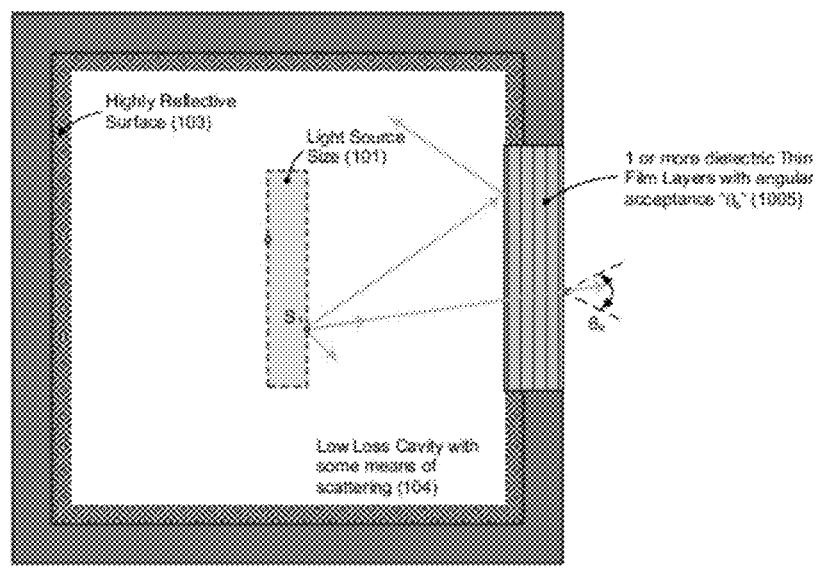
FIG. 10 shows an embodiment of the invention as applied to any light source within a light fixture.

FIG. 10 shows another embodiment of the invention. As applied to a generic light system similar to FIG. 1, where there is a dielectric layer 1005 at the exit aperture which further brightens the light source by restricting the angles of light escaping the lighting system.

In an alternative embodiment of the invention, the invention can be applied to any light source within a light fixture as generically shown in FIG. 10. For such configurations, it may not be to increase the brightness beyond the light source. Rather the purpose of the dielectric film is to decrease the divergence of the emission profile from the light fixture.

Figure 11:
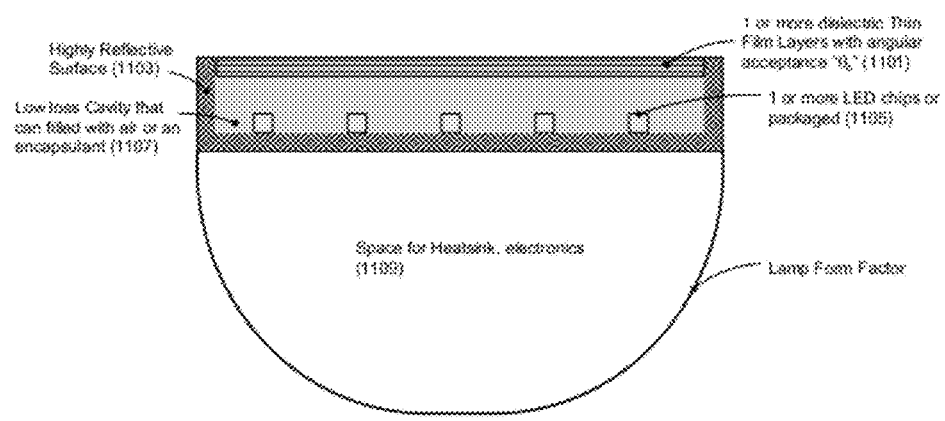
FIG. 11 shows an embodiment of the invention as applied in an LED in a MR or PAR form factor.

FIG. 11 shows a sample embodiment of the invention for LED in a lamp. The LED lamp can be one of the standard lamp form factor. This includes lamp form factor such as A, PAR MR, R, BR, HR, S, G, and T. One or more LED chips or packages 1105 are in a low loss cavity 1107 surrounded on three sides by highly reflective surfaces 1103. At least a portion of the cavity scatters light. A dielectric layer 1101 is placed over the exiting surface of the lamp. Electronics such as heat sinks 1109 are placed at the back of the lamp. The light emission from the lamp becomes more directional (lower divergence) with the addition of the dielectric layer.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:
1. An LED device comprising:
an LED chip;
a scattering mechanism formed as part of the LED chip, wherein the scattering mechanism comprises a textured surface and light emitted by the LED chip exits through the textured surface;
an exit aperture on the LED chip where a majority of light emitted by the LED chip exits;
at least one dielectric layer coupled to the LED chip exit aperture;
at least one reflective layer coupled to the LED chip; and a full width half angle of a light emission profile is less than a hundred degrees.

2. The device of claim 1 wherein the dielectric layer comprises at least four dielectric layers.

3. The device of claim 1 wherein the textured surface is approximately Lamberian.

4. The device of claim 1 wherein the textured surface is part of the exit.

5. The device of claim 4 wherein the textured surface comprises a smoothing layer on which the dielectric layer is attached.

6. The device of claim 5 wherein the smoothing layer comprises a silicon nitride material.

7. The device of claim 1 wherein the full width half maximum of the light emission profile is less than 90 degrees.

8. The device of claim 1 wherein the full width half maximum of the light emission profile is less than 80 degrees.

9. The device of claim 1 wherein the full width half maximum of the light emission profile is less than 60 degrees.

10. The device of claim 1 wherein the full width half maximum of the light emission profile is less than 40 degrees.

11. An LED device compromising:
an LED chip;
a scattering layer coupled to the LED chip, wherein the scattering mechanism comprises a textured surface and light emitted by the LED chip exits through the textured surface;
an exit aperture on the LED chip through which light emitted by the LED chip exits;
at least one dielectric layer coupled to the LED chip exit aperture, wherein
the dielectric layer transmits light of low angles, and
the dielectric layer reflects light of higher angles toward the scattering layer or reflective layer, or both;
at least one reflective layer coupled to the LED chip wherein the reflective layer redirects light back towards the exit aperture of the LED; and
a full width half angle of a light emission profile is less than one hundred degrees.

12. An LED light source compromising:
an LED chip in a cavity, wherein
the cavity comprises at least two highly reflective walls on opposite sides of the LED chip and a light exit aperture, and a space in the cavity separates the two at least two highly reflective walls from the LED chip, and
at least a portion of a cavity wall scatters light;
one or more dielectric layers at the light exit aperture, wherein
the dielectric layer transmits light of low angles, and
the dielectric layer reflects light of higher angles toward the scattering layer or reflective layer, or both; and
a full width half angle of a light emission profile of light out of the cavity is less than a hundred degrees.

13. The LED light source of claim 12 wherein the full width half angle of the light emission profile is less than less than 80 degrees.

14. The LED light source of claim 12 wherein the full width half angle of the light emission profile is less than less than 60 degrees.

15. The LED light source of claim 12 wherein the full width half angle of the light emission profile is less than less than 40 degrees.

* * * * *